(12) United States Patent
Tsukiji et al.

(10) Patent No.: US 6,746,964 B2
(45) Date of Patent: Jun. 8, 2004

(54) METHOD OF MANUFACTURING SEMICONDUCTOR LASER ELEMENT

(75) Inventors: Naoki Tsukiji, Tokyo (JP); Satoshi Irino, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 10/032,580

(22) Filed: Jan. 2, 2002

(65) Prior Publication Data

US 2003/0008530 A1 Jan. 9, 2003

(30) Foreign Application Priority Data

Jul. 6, 2001 (JP) ........................................ 2001-206996

(51) Int. Cl.[7] ...................... H01L 21/302; H01L 21/461
(52) U.S. Cl. ........................ 438/712; 438/535; 438/798
(58) Field of Search ............................... 438/535, 712, 438/717, 736, 738, 798, 940

(56) References Cited

U.S. PATENT DOCUMENTS

| 4,806,442 A | * | 2/1989 | Shirasaki et al. ............... 430/4 |
| 6,104,738 A | * | 8/2000 | Kitoh et al. ................... 372/46 |
| 6,384,963 B2 | | 5/2002 | Ackerman et al. |

* cited by examiner

*Primary Examiner*—David Nhu
(74) *Attorney, Agent, or Firm*—Oblon, Spivak, McClelland, Maier & Neustadt, P.C.

(57) ABSTRACT

Provided is a method of manufacturing a semiconductor laser element for collectively forming semiconductor laser elements having diffraction grating partially provided at least on the side of laser light emitting end surface or laser light reflection end surface side using a semiconductor process technique. The method comprises the step of performing electron beam exposure or ion beam exposure for drawing only on a diffraction grating region on which said diffraction grating is provided in correspondence with a pattern of said diffraction grating, and masking the diffraction grating region and exposing a region other than said diffraction grating region with light or X-rays.

15 Claims, 6 Drawing Sheets

METHOD OF MANUFACTURING SEMICONDUCTOR LASER ELEMENT

FIELD OF THE INVENTION

The present invention relates to a method of manufacturing semiconductor laser element/s for collectively forming semiconductor laser elements and then for forming each of the semiconductor laser elements. More particularly, this invention relates to a method of manufacturing semiconductor laser element/s capable of forming a semiconductor laser element having a diffraction grating for a short time.

BACKGROUND OF THE INVENTION

Conventionally, a semiconductor laser element is formed in such a manner that semiconductor laser elements are collectively formed on a compound semiconductor board using a semiconductor process technique and then, the semiconductor laser elements are cut out into separately by a cleavage. When a fine pattern such as a diffraction grating is formed on a portion of each the semiconductor laser element, since such a fine pattern exists, drawing processing is conducted by electron beam, and a step of conducting exposure processing by the drawing is necessary.

FIG. 7A to FIG. 7G show the conventional semiconductor process for explaining how the diffraction grating is formed on a portion of a semiconductor laser element. First, a cladding layer 4a is deposited on an upper surface of a not shown active layer, and a diffraction grating film 13a forming the diffraction grating 13 is deposited on an upper surface of the cladding layer 4a. Further, an SiN film 21 is deposited on an upper surface of a diffraction grating film 13a as a file for forming a pattern of the diffraction grating 13, a resist film 22 is applied on an upper surface of the diffraction grating film 13a, thereby forming the resist film 22 (see FIG. 7A). This resist film 22 is a material reacting with electron beam exposure.

Then, the entire surface of the resist film 22 is subjected to electron beam exposure that draws a diffraction grating pattern with electron beam, and developing processing is conducted. As a result, a resist film 22a corresponding to the pattern of the diffraction grating 13 is formed (see FIG. 7B).

Thereafter, as shown in (see FIG. 7C), the SiN film 21 is subjected to reactive ion etching in $CF_4$ gas using the resist film 22a. As a result, an SiN film 21a corresponding to the pattern of the diffraction grating 13 is formed.

Thereafter, the resist film 22a is removed. Further, the diffraction grating film 13a and the cladding layer 4a are masked with an SiN film 21a having a pattern corresponding to the diffraction grating 13 and in this state, the diffraction grating film 13a and the cladding layer 4a are subjected to the reactive ion etching (see FIG. 7E). With this operation, a shape of the diffraction grating 13 is formed.

Figure 7A:
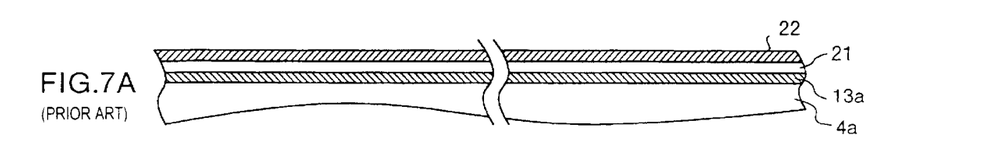
FIG. 7A and FIG. 7G are process diagrams showing a forming steps of the diffraction grating in a conventional manufacturing step of the semiconductor laser element.
Figure 7B:
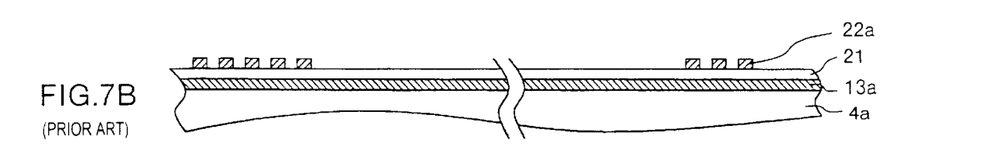
Figure 7C:
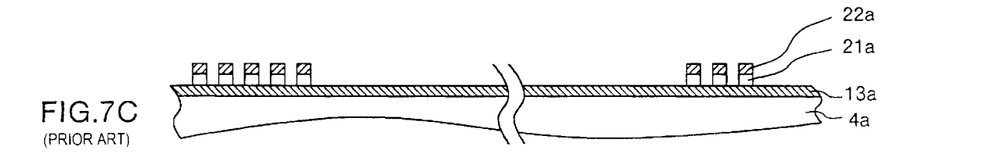
Figure 7D:
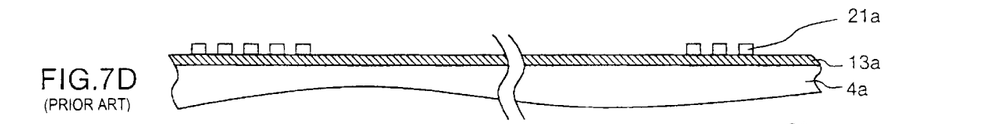
Figure 7E:
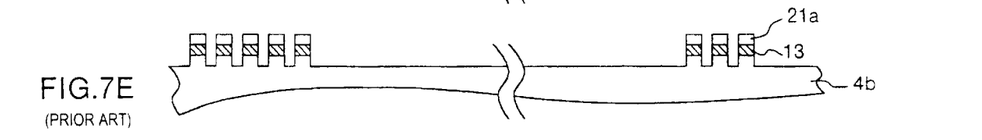
Figure 7F:
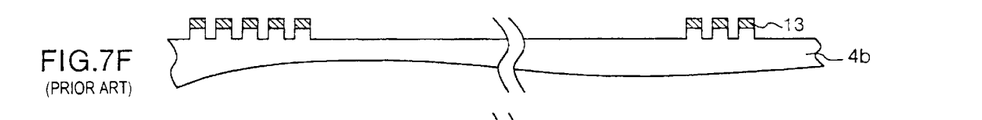
Figure 7G:
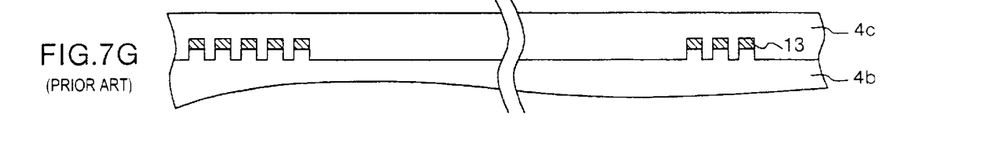

Further, the SiN film 21a is removed (see FIG. 7F), a cladding layer 4c that is the same as the cladding layer 4b is embedded in upper portions of the cladding layer 4a and the diffraction grating 13 and is allowed to grow, and the diffraction grating 13 is finally formed in a state in which the diffraction grating 13 is wrapped in the cladding layer 4c (see FIG. 7G).

In the conventional method of manufacturing the semiconductor laser element, however, the entire surface of the resist film 22 is subjected to the electron beam exposure because of the diffraction grating 13 formed on a portion of the semiconductor laser element. Therefore, time required for the electron beam exposure becomes excessively long and as a result, there are problems that time required for manufacturing the semiconductor laser element and productivity is lowered.

SUMMARY OF THE INVENTION

It is an object of the invention to provide a method of manufacturing a semiconductor laser element capable of enhancing the productivity of the semiconductor laser elements including a structure such as a partially formed diffraction grating.

The method of manufacturing a semiconductor laser element according to one aspect of this invention is a method of collectively forming, on a semiconductor board, a semiconductor laser element having a diffraction grating partially provided at least on the side of laser light emitting end surface or laser light reflection end surface side using a semiconductor process technique. The method comprises the steps of performing electron beam exposure or ion beam exposure for drawing only on a diffraction grating region on which the diffraction grating is provided in correspondence with a pattern of the diffraction grating; and masking the diffraction grating region and exposing a region other than the diffraction grating region with light or X-rays.

Thus, when the diffraction grating partially provided at least on the side of laser light emitting end surface or laser light reflection end surface side is formed, in the first exposing step, electron beam exposure or ion beam exposure is conducted for drawing only on a diffraction grating region on which the diffraction grating is provided in correspondence with a pattern of the diffraction grating, and in the second exposing step, the diffraction grating region is masked and the region other than the diffraction grating region is exposed with light or X-rays. With this method, time required for the electron beam exposure or ion beam exposure taking long exposing time per unit area is minimized.

The method of manufacturing a semiconductor laser element according to another aspect of this invention is a method of collectively forming, on a semiconductor board, a semiconductor laser element having a diffraction grating partially provided at least on the side of laser light emitting end surface or laser light reflection end surface side using a semiconductor process technique. The method comprises a first resist forming step of sequentially forming, on an upper surface of an upper cladding layer, a diffraction grating film for forming the diffraction grating, a pattern forming film for forming a pattern of the diffraction grating and a first resist film for electron beam exposure or ion beam exposure, a first exposing step of performing electron beam exposure or ion beam exposure for drawing the first resist film of the diffraction grating region on which the diffraction grating is provided in correspondence with the diffraction grating, and for carrying out developing, a first etching step of etching the pattern forming film by the pattern of the first resist film remained by the first exposing step, and for removing the first resist film, the second resist forming step of forming a second resist film for light exposure or X-ray exposure on an upper surface of pattern forming film exposed by the diffraction grating film and the first etching step, a second exposing step in which an upper surface of the diffraction grating region is masked, the first resist film formed on a region other than the diffraction grating region is exposed with light or X-rays, and developing is carried out, a second etching step of etching a pattern forming film exposed by the second exposing step, a removing step of removing the second resist film remained on an upper surface of the diffraction grating region, a third etching step in which etching is carried out using the pattern forming film exposed by the removing step, and an embedding step in which another upper cladding layer is further embedded in the diffraction grating exposed by the third etching step and an upper surface of the former cladding layer, and allowing the other cladding layer to grow.

Thus, when the diffraction grating partially provided at least on the side of laser light emitting end surface or laser light reflection end surface side is formed, in the first resist forming step, on an upper surface of an upper cladding layer, a diffraction grating film for forming the diffraction grating, a pattern forming film for forming a pattern of the diffraction grating and a first resist film for electron beam exposure or ion beam exposure are for sequentially forming, in the first exposing step, electron beam exposure or ion beam exposure is carried out for drawing the first resist film of the diffraction grating region on which the diffraction grating is provided in correspondence with the diffraction grating, and the developing is carried out, in the first etching step, the pattern forming film is etched by the pattern of the first resist film remained by the first exposing step and the first resist film is removed, the second resist forming step of forming a second resist film for light exposure or X-ray exposure on an upper surface of pattern forming film exposed by the diffraction grating film and the first etching step, in the second exposing step, an upper surface of the diffraction grating region is masked, the first resist film formed on a region other than the diffraction grating region is exposed with light or X-rays, and developing is carried out, in the second etching step, the pattern forming film exposed by the second exposing step is etched, in the removing step, the second resist film remained on an upper surface of the diffraction grating region is removed, in the third etching step, etching is carried out using the pattern forming film exposed by the removing step, the diffraction grating is formed, the pattern forming film is removed, and in the embedding step, embedding another upper cladding layer is further embedded in the diffraction grating exposed by the third etching step and an upper surface of the former cladding layer, and allowing the other cladding layer to grow. As a result, time required for the electron beam exposure or ion beam exposure taking long exposing time per unit area is minimized.

The method of manufacturing a semiconductor laser element according to still another aspect of this invention is a method of collectively forming, on a semiconductor board, a semiconductor laser element having a diffraction grating partially provided at least on the side of laser light emitting end surface or laser light reflection end surface side using a semiconductor process technique. The method comprises the steps of sequentially forming, on an upper surface of an upper cladding layer, a diffraction grating film for forming the diffraction grating, a pattern forming film for forming a pattern of the diffraction grating and a negative resist film for electron beam exposure or ion beam exposure; and performing electron beam exposure or ion beam exposure for drawing only on a diffraction grating region on which the diffraction grating is provided in correspondence with a pattern of the diffraction grating.

Thus, in the resist forming step, on an upper surface of an upper cladding layer, a diffraction grating film for forming the diffraction grating, a pattern forming film for forming a pattern of the diffraction grating and a negative resist film for electron beam exposure or ion beam exposure are sequentially formed, and in the exposing step, electron beam exposure or ion beam exposure for drawing only on a diffraction grating region on which the diffraction grating is provided in correspondence with a pattern of the diffraction grating is carried out. With this method, time required for the electron beam exposure or ion beam exposure taking long exposing time per unit area is minimized.

Other objects and features of this invention will become apparent from the following description with reference to the accompanying drawings.

BRIEF DESCRIPTION OF THE DRAWINGS

FIG. 5A to FIG. 5I are process diagrams showing forming steps of a diffraction grating in a manufacturing step of the semiconductor laser element shown in FIG. 1;

FIG. 6A to FIG. 6G are process diagrams showing forming steps of the diffraction grating in a manufacturing step of a semiconductor laser element of a second embodiment of the invention.

DESCRIPTION OF THE PREFERRED EMBODIMENTS

Embodiments of a method of manufacturing a semiconductor laser element according to the present invention will be explained below with reference to the accompanying drawings.

Figure 1:
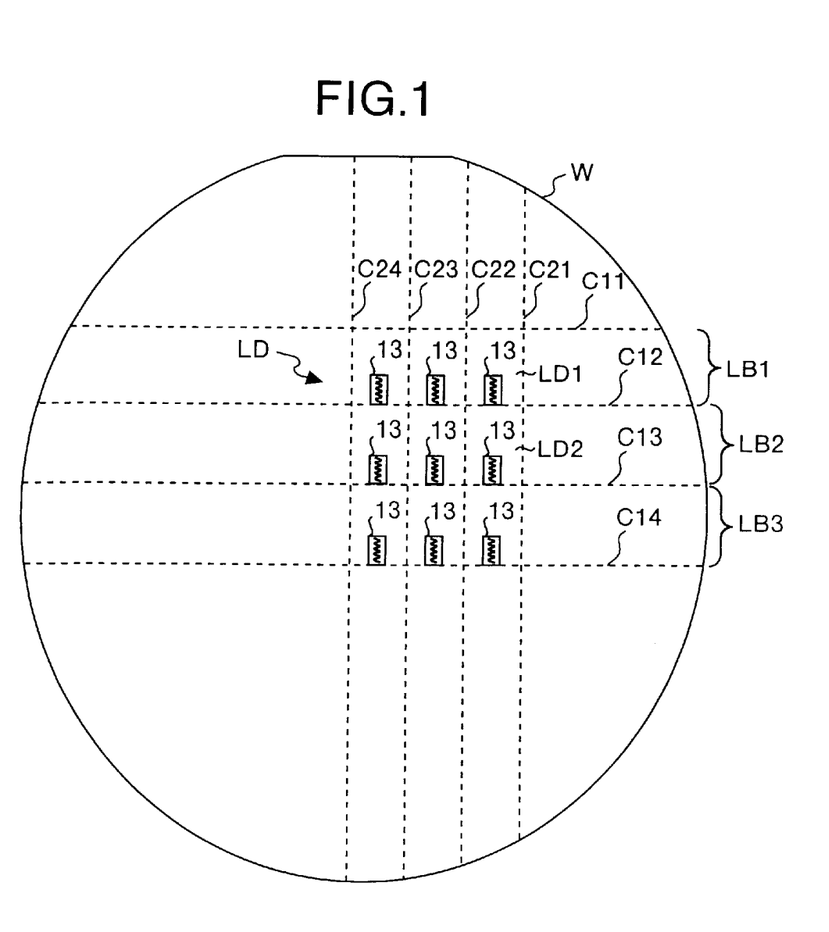
FIG. 1 is a plan diagram of a semiconductor wafer in which semiconductor laser elements are collectively formed that is a first embodiment of the present invention.

To begin with, a first embodiment of the invention will be explained. FIG. 1 is a plan diagram of a semiconductor wafer in which semiconductor laser elements are collectively formed that is a first embodiment of the present invention. The semiconductor laser element group LD comprises semiconductor laser elements LD1, LD2 and is formed on a semiconductor wafer W. The semiconductor laser element group LD is an InP system semiconductor laser element group. Each semiconductor laser element uses an n-InP compound semiconductor as a board, and as a structure shown in FIG. 2 to FIG. 4 (see Japanese Patent Application No.2001-134545).

Figure 2:
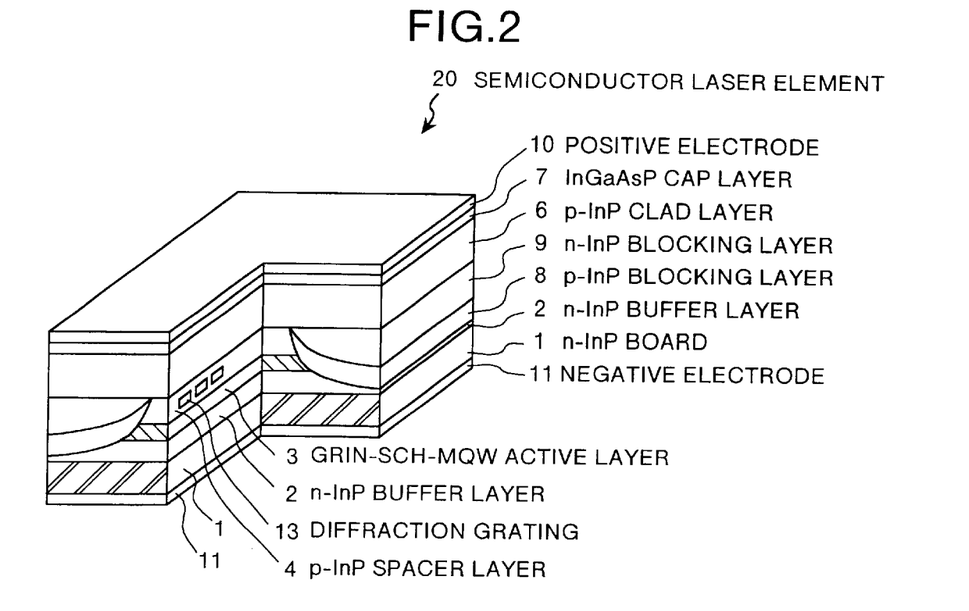
FIG. 2 is a perspective cutaway diagram of the semiconductor laser element cut out from the semiconductor wafer shown in FIG. 1.
Figure 3:
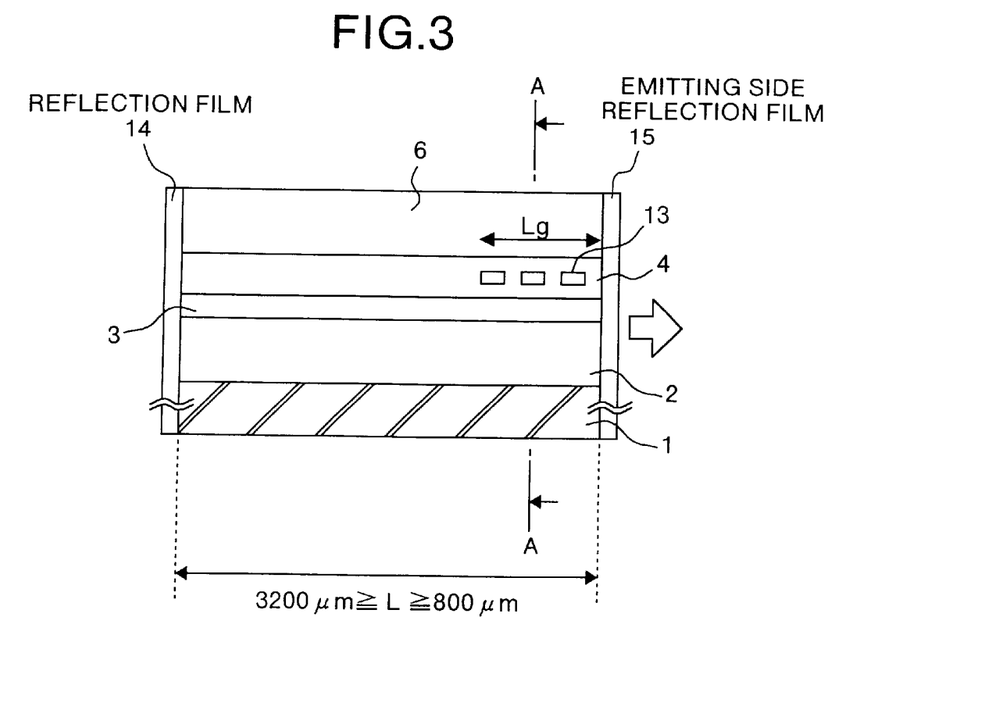
FIG. 3 is a vertical sectional diagram of the semiconductor laser element shown in FIG. 2 in its longitudinal direction shown in FIG. 2 showing a schematic structure thereof.
Figure 4:
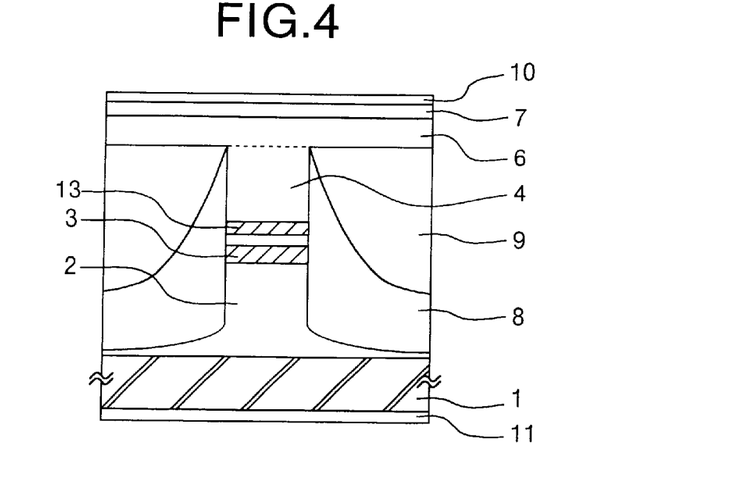
FIG. 4 is a sectional diagram of the semiconductor laser element taken along a line A—A in FIG. 2.

FIG. 2 is a perspective cutaway diagram of the structure of semiconductor shown in FIG. 1. FIG. 3 is a vertical sectional diagram of the semiconductor laser element shown in FIG. 2 in its longitudinal direction. FIG. 4 is a sectional diagram of the semiconductor laser element taken along a line A—A in FIG. 2. In FIG. 2 to FIG. 4, the semiconductor laser element 20 comprises an n-InP buffer layer 2 serving as an n-InP buffer layer and a lower cladding layer, a GRIN-SCH-MQW (Graded Index-Separate Confinement Heterostructure Multi Quantum Well) active layer 3 having compression distortion, a p-InP spacer layer 4, a P-InP cladding layer 6 and an InGaAsP cap layer 7 which are laminated in this order on a surface (100) of an n-InP board 1.

The p-InGaAsP diffraction grating 13 extending from an emitting side reflection film 15 by 100 μm and having a thickness of 20 nm is periodically formed in the p-inP spacer layer 4 at a pitch of about 220 nm, and a laser light having center wavelength of 1.48 μm is selected.

The p-inP spacer layer 4 including the diffraction grating 13, the GRIN-SCH-MQW active layer 3 and an upper portion of the n-InP buffer layer 2 are formed into mesa-stripes. Opposite sides of the mesa-stripes are buried in the p-InP blocking layer 8 and the n-InP blocking layer 9 formed as current blocking layers. A positive electrode 10 is formed on an upper surface of the InGaAsP cap layer 7, and a negative electrode 11 is formed on a back surface of the n-InP board 1.

A reflection film 14 having high light reflection factor of 80% or higher is formed on a light reflecting end surface that is one end surface of the semiconductor laser element 20 in its longitudinal direction. An emitting side reflection film 15 having low light reflection factor of 2% or lower and more preferably 1% or lower is formed on the light emitting end surface that is the other end surface of the semiconductor laser element 20. Light generated in the GRIN-SCH-MQW active layer 3 that of an optical resonator formed by the reflection film 14 and the emitting side reflection film 15 is reflected by the reflection film 14, and emitted as laser light through the emitting side reflection film 15. Length L of the resonator is about 800 to 3200 μm. A value of product k·Lg of coupling coefficient k of the diffraction grating 13 and length Lg of the diffraction grating is about 0.1.

The diffraction grating 13 is provided in the semiconductor laser element 20 in the vicinity of the GRIN-SCH-MQW active layer 3 and on the side of the emitting side reflection film 15. With this structure, a plurality of oscillation vertical modes can be obtained in the oscillation wavelength spectrum. When the semiconductor laser element 20 is used as an exciting light source for Raman amplifier, stable and high Raman gain can be obtained without generating induction Brillouin scattering.

Further, each of the semiconductor laser element LD1, LD2 structured semiconductor laser element group LD is disposed the structure excluding the reflection film 14 of semiconductor laser element 20 and the emitting side reflection film 15 as the semiconductor wafer W.

The semiconductor laser element group LD is formed on the semiconductor wafer W as described above. In this case, the semiconductor using the semiconductor process technique laser element group LD is disposed on the semiconductor wafer W in a form of matrix, and the diffraction grating 13 on each semiconductor laser element.

Thereafter, the semiconductor laser element group LD is cleaved by cleavage planes C11 to C14 to form laser bars LB1 to LB3. Further, each of the cleavage planes of the laser bars LB1 to LB3 coated, and the emitting side reflection film 15 is formed and the reflection film 14 is formed.

Thereafter, the laser bars LB1 to LB3 on which the emitting side reflection film 15 and the reflection film 14 are formed are cleaved separately in correspondence with the cleavage plane C21 to C24, and each of the laser bars are cut out as semiconductor laser elements.

FIG. 5A to FIG. 5I are semiconductor process diagrams for explaining how the diffraction grating 13 shown in FIG. 1 is formed. First, a cladding layer 4a that will become the n-InP spacer layer 4 is first deposited on the upper surface of the GRIN-SCH-MQW active layer 3, and a diffraction grating film 13a forming the diffraction grating 13 is deposited on an upper surface of the cladding layer 4a. Then, an SiN film 21 is deposited on an upper surface of the diffraction grating film 13a as a film for forming a pattern of the diffraction grating 13. Then, a first resist film 22 is applied on an upper surface of the SiN film 21 (see FIG. 5A). This first resist film 22 is a positive resist material reacting with the electron beam exposure.

Figure 5A:
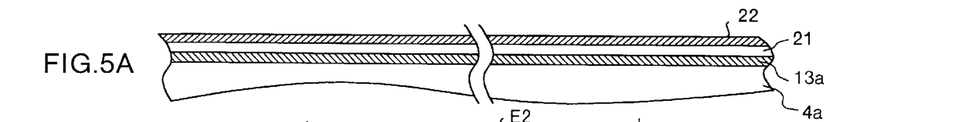
Figure 5B:
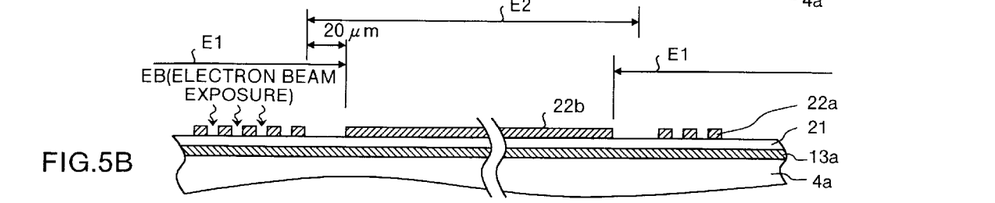

Then, a diffraction grating pattern is drawn by electron beam on only a diffraction grating region E1 of the first resist film 22 on which the diffraction grating 13 is formed, electron beam exposure is conducted and the developing processing is conducted. As a result, a first resist film 22a corresponding to the pattern of the diffraction grating 13 is formed. At that time, a pattern is drawn on the diffraction grating region E1 on the side of a non-diffraction grating region E2 where the diffraction grating 13 is not formed through a predetermined margin. As shown in FIG. 5B, a margin of 20 μm width is provided with respect to 100 μm length of the diffraction grating 13, and the electron beam exposure is conducted in this margin width. As a result, regions of the opposite ends of the non-diffraction grating region E2 having 20 μm width are not subjected to the electron beam exposure, and these regions are remained, and the first resist films 22b are formed on these regions.

Figure 5C:
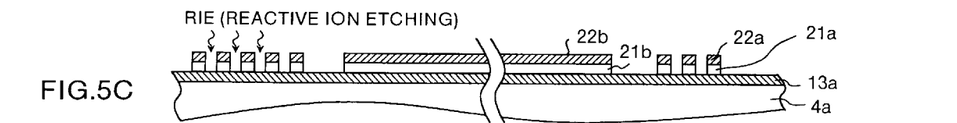
Figure 5D:
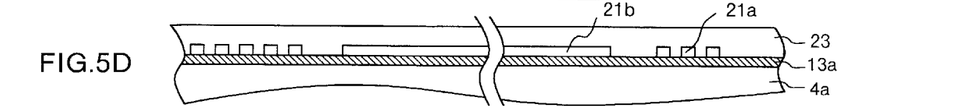
Figure 5E:
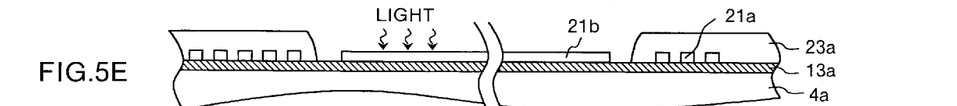

Then, as shown in FIG. 5C, the SiN film 21 is subjected to the reactive ion etching in $CF_4$ gas using the first resist films 22a and 22b. As a result, the SiN film 21a corresponding to the pattern of the diffraction grating 13 and the SiN film 21b corresponding to the first resist film 22b are formed.

Then, the first resist films 22a and 22b are removed. Further, a second resist film 23 is applied such as to cover the SiN films 21a and 21b exposed by removing the first resist films 22a and 22b, thereby forming the second resist film 23 (see FIG. 5D). This second resist film 23 is a material reacting the light exposure.

Further, using a glass mask for masking the diffraction grating region E1, a second resist film in a region of an upper layer of the SiN film 21b retreated from the opposite ends of the non-diffraction grating region E2 by 20 μm is subjected to ultraviolet (UV) contact exposure. As a result, the SiN film 21 is exposed, and the second resist film 23a is remained in an upper portions of the SiN film 21a corresponding to a pattern of the diffraction grating 13. (see FIG. 5E).

Figure 5F:
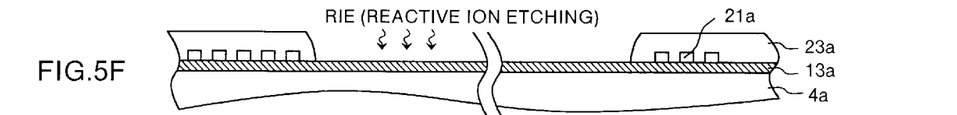
Figure 5G:
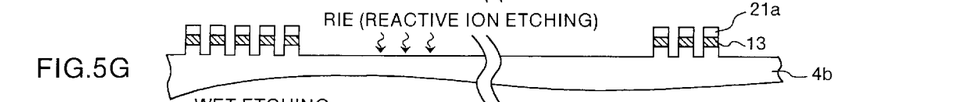

Then, the SiN film 21b is subjected to the reactive ion etching in CF4 to remove the SiN film 21b (see FIG. 5F). Further, the second resist film 23a is removed, and the diffraction grating film 13a and the cladding layer 4a are masked with the SiN film 21a having a pattern corresponding to the diffraction grating 13. In this state, the diffraction grating film 13a and the cladding layer 4a are subjected to the reactive ion etching (see FIG. 5G). With this operation, a shape of the diffraction grating 13 is formed.

Figure 5H:
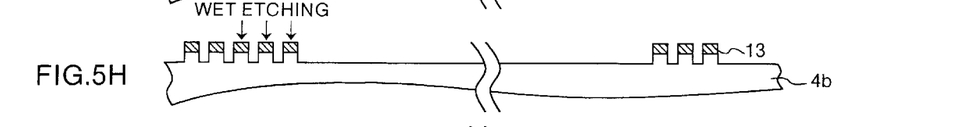
Figure 5I:
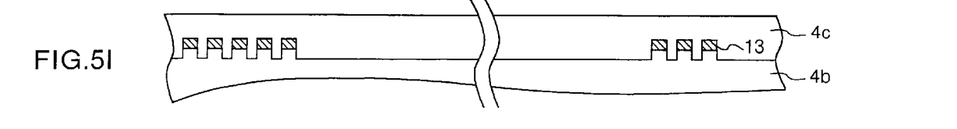
Figure 6A:
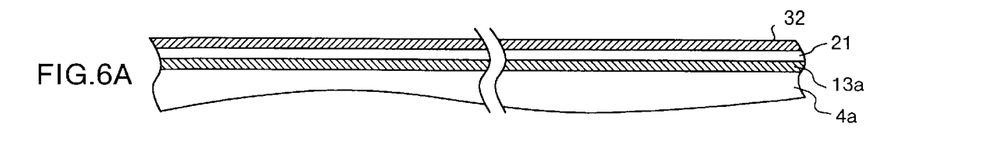
Figure 6B:
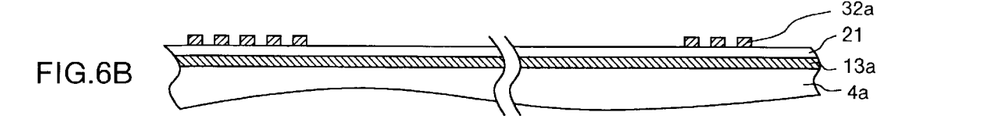
Figure 6C:
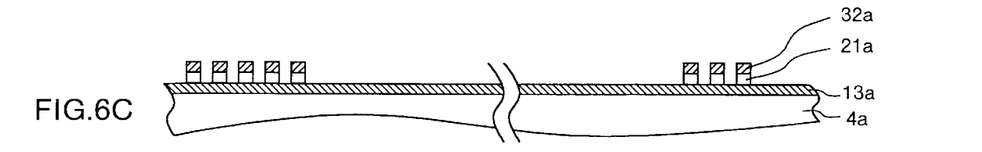
Figure 6D:
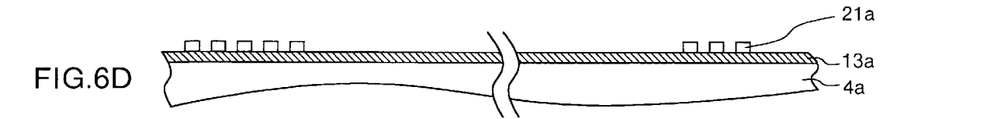
Figure 6E:
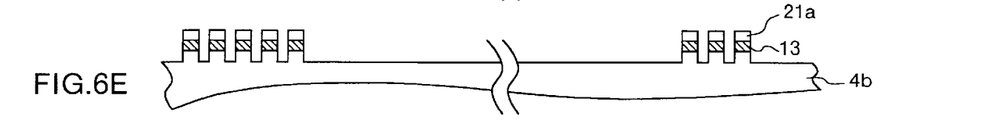
Figure 6F:
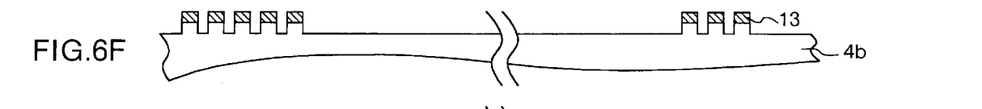
Figure 6G:
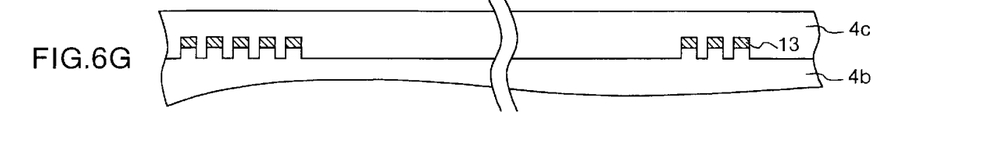

Further, the SiN film 21a is removed by wet etching (see FIG. 5H). The cladding layer 4c that is the same as the cladding layer 4b is embedded in upper portions of the cladding layer 4a and the diffraction grating 13 and is allowed to grow, and the diffraction grating 13 is wrapped in the cladding layer 4 (see p-inP spacer layer 4 in FIG. 2 to FIG. 4), and the diffraction grating is finally formed (see FIG. 5I).

In the first embodiment, the electron beam exposure for first resist film 22 for forming a pattern of the diffraction grating 13 is conducted only for the diffraction grating region E1, and regions other than the diffraction grating region E1 are subjected to light exposure using a mask. Therefore, the manufacturing time of the final semiconductor laser element can remarkably be shortened.

Especially, when an area rate of the semiconductor wafer W occupied by the diffraction grating 13 is 10% or less and the semiconductor wafer W is a two-inch wafer, the electron beam exposure time for only the diffraction grating region E1 is three hours. Whereas, in the conventional method of manufacturing the semiconductor laser element in which the entire surface of the first resist film 22 is subjected to the electron beam exposure, the electron beam exposure time is 30 hours. Therefore, the electron beam exposure time that largely affect the manufacturing time of the semiconductor laser element becomes one-tenth or shorter and thus, the manufacturing time of the semiconductor laser element is remarkably shortened.

If the electron beam exposure time becomes long, it is difficult to secure the stability of the electron beam. According to this embodiment, therefore, the diffraction grating 13 can stably be formed.

In the first embodiment, the electron beam exposure is conducted for exposing the diffraction grating region E1 with light, but the exposure method is not limited to this only, and the ion beam exposure may be conducted alternatively. The region other than the diffraction grating region E1 was exposed with the ultraviolet, but the invention is not limited to this, and the region may be exposed with X-rays. In short, the diffraction grating region E1 on which diffraction grating that is a fine pattern should be exposed with beams, and other larger regions should be sequentially exposed with light using a mask or collectively, there shortening the exposure time.

The diffraction grating 13 was provided on the emitting surface side in the first embodiment, however, the invention is not limited to this, and the invention can also be applied to a structure in which the diffraction grating is provided only on the reflection surface side and a structure in which the diffraction gratings are provided on both the emitting surface side and the reflection surface side. In case of the latter structure in which the diffraction gratings are provided on both the emitting surface side and the reflection surface side, the electron beam exposure is conducted only for the diffraction grating region E1.

Next, a second embodiment of the invention will be explained. In the first embodiment, the first resist films 22, 22a and 22b are made of positive resist materials. The reason why the positive resist materials are used is that under present circumstances, resolution of the positive resist material when the electron beam exposure is conducted is higher as compared with negative resist material, and fine working in the order of nm is possible.

Therefore, if a negative resist material realizing high resolution appears, or if high resolution is not required for pitch or shape of diffraction grating, a negative resist films 32 and 32a can be used instead of the resist films 22 and 22a shown in FIG. 7A to FIG. 7G.

FIG. 6A to FIG. 6G are semiconductor process diagrams for explaining how the diffraction grating in a semiconductor laser element of the second embodiment of the invention is formed. The steps shown in FIG. 6A to FIG. 6G are carried out using the negative resist films 32 and 32a instead of the resist films 22 and 22a. Other steps are the same as those of the forming steps of diffraction grating. In this case, only portions of the negative resist films 32 and 32a which were radiated with ion beams are hardened. Therefore, only the diffraction grating region is exposed with light.

Therefore, in the second embodiment, time required for the electron beam exposure or ion beam exposure is shortened, and steps concerning the non-diffraction grating region E2 are shortened. Therefore, time required for the entire manufacturing procedure of the semiconductor laser elements is further shortened, and the productivity is further enhanced. Further, unstable exposure due to long time irradiation of electron beams or ion beams is less prone to be generated, and yield of the semiconductor laser elements is prevented from being lowered.

As described above, according to the present invention, when the diffraction grating partially provided at least on the side of laser light emitting end surface or laser light reflection end surface side is formed using semiconductor process technique, in the first exposing step, electron beam exposure or ion beam exposure is conducted for drawing only on a diffraction grating region on which the diffraction grating is provided in correspondence with a pattern of the diffraction grating, and in the second exposing step, the diffraction grating region is masked and the region other than the diffraction grating region is exposed with light or X-rays. With this method, time required for the electron beam exposure or ion beam exposure taking long exposing time per unit area is minimized. Therefore, the exposure when the diffraction grating is formed is remarkably shortened, the manufacturing time of the entire semiconductor laser elements, the productivity is enhanced, unstable exposure due to long time irradiation of electron beams or ion beams is less prone to be generated, and yield of the semiconductor laser elements is prevented from being lowered.

Furthermore, when the diffraction grating partially provided at least on the side of laser light emitting end surface or laser light reflection end surface side is formed using the semiconductor process technique, in the first resist forming step, on an upper surface of an upper cladding layer, a diffraction grating film for forming the diffraction grating, a pattern forming film for forming a pattern of the diffraction grating and a first resist film for electron beam exposure or ion beam exposure are for sequentially forming, in the first exposing step, electron beam exposure or ion beam exposure is carried out for drawing the first resist film of the diffraction grating region on which the diffraction grating is provided in correspondence with the diffraction grating, and the developing is carried out, in the first etching step, the pattern forming film is etched by the pattern of the first resist film remained by the first exposing step and the first resist film is removed, the second resist forming step of forming a second resist film for light exposure or X-ray exposure on an upper surface of pattern forming film exposed by the diffraction grating film and the first etching step, in the second exposing step, an upper surface of the diffraction grating region is masked, the first resist film formed on a region other than the diffraction grating region is exposed with light or X-rays, and developing is carried out, in the second etching step, the pattern forming film exposed by the second exposing step is etched, in the removing step, the second resist film remained on an upper surface of the diffraction grating region is removed, in the third etching step, etching is carried out using the pattern forming film exposed by the removing step, the diffraction grating is formed, and the pattern forming film is removed, and in the embedding step, embedding another upper cladding layer is further embedded in the diffraction grating exposed by the third etching step and an upper surface of the former cladding layer, and allowing the other cladding layer to grow. As a result, time required for the electron beam exposure or ion beam exposure taking long exposing time per unit area is minimized. Therefore, the exposure time when the diffraction grating is formed is remarkably shortened, the manufacturing time of the entire semiconductor laser elements, the productivity is enhanced, unstable exposure due to long time irradiation of electron beams or ion beams is less prone to be generated, and yield of the semiconductor laser elements is prevented from being lowered.

Moreover, the region of a region other than the diffraction grating region in a boundary between the diffraction grating region and the region other than the diffraction grating region is provided with a superposing region having a predetermined width, and when the electron beam exposure or ion beam exposure is conducted, the superposed region is also exposed, and when light exposure or X-ray exposure is conducted, the superposed region is also exposed. Therefore, even if positional deviation is generated between during the electron beam exposure or ion beam exposure and during light exposure or X-ray exposure, the resist can reliably be removed, and yield of the semiconductor laser elements is prevented from being lowered.

Furthermore, in the resist forming step, on an upper surface of an upper cladding layer, a diffraction grating film for forming the diffraction grating, a pattern forming film for forming a pattern of the diffraction grating and a negative resist film for electron beam exposure or ion beam exposure are sequentially formed, and in the exposing step, electron beam exposure or ion beam exposure for drawing only on a diffraction grating region on which the diffraction grating is provided in correspondence with a pattern of the diffraction grating is carried out. With this method, time required for the electron beam exposure or ion beam exposure taking long exposing time per unit area is minimized. The exposure time when the diffraction grating is formed is remarkably shortened, the productivity is enhanced, unstable exposure due to long time irradiation of electron beams or ion beams is less prone to be generated, and yield of the semiconductor laser elements is prevented from being lowered.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor laser device having a diffraction grating structure, the method comprising:
    forming a layer of diffraction grating material for making the diffraction grating structure;
    performing a beam exposure technique only in at least one first area of said layer where said diffraction grating structure is formed;
    masking said diffraction grating structure; and
    performing a non-beam exposure technique in a second area of said layer where said diffraction grating structure is not formed.

2. The method of claim 1, wherein said forming a layer of diffraction grating material for making the diffraction grating structure comprises forming a layer of diffraction grating material having a thickness of about 20 nm.

3. The method of claim 1, wherein said performing a beam exposure technique comprises exposing said at least one first area using one of an electron beam and an ion beam.

4. The method of claim 1, wherein said performing a non-beam exposure technique comprises exposing said second area using one of ultraviolet light exposure and x-ray exposure.

5. The method of claim 1, wherein said at least one first area of the layer is larger than the diffraction grating structure by a predetermined margin.

6. The method of claim 5, wherein said predetermined margin is larger than 20 microns.

7. The method of claim 1, further comprising:
    forming said layer of diffraction grating material on an upper surface of an upper cladding layer of the semiconductor laser device;
    forming a pattern forming film on said layer of diffraction grating material; and
    forming a resist film on said pattern forming film, wherein said step of performing said beam exposure technique comprises performing beam exposure only in a partial area of said resist film where said diffraction grating structure is formed.

8. The method of claim 7, wherein said forming a resist film comprises forming a positive resist film.

9. The method of claim 7, wherein said forming said layer of diffraction grating material comprises forming said layer of diffraction grating material on an upper surface of a P-InP cladding layer of the semiconductor laser device.

10. The method of claim 7, wherein said forming a pattern forming film comprises forming an SiN pattern forming film on said layer of diffraction grating material.

11. The method of claim 6, wherein said forming a diffraction grating comprises forming said diffraction grating adjacent to a light emitting facet of the semiconductor laser element.

12. The method of claim 1, wherein said forming a diffraction grating comprises forming said diffraction grating adjacent to a light reflecting facet of the semiconductor laser element.

13. A method of manufacturing a semiconductor laser element having an integrated diffraction grating, said method comprising:
    forming a grating film on the surface of a cladding layer of the semiconductor laser element;
    forming a pattern forming film on said grating film, and forming a first resist film on said pattern forming film;
    performing a beam exposure only in a predetermined area of the first resist film to expose a grating pattern of the grating structure in said predetermined area;
    developing the first resist film to remove the first resist film the pattern forming film except form remaining first resist film corresponding to said exposed grating pattern in said predetermined area and first resist film outside of said predetermined area;
    etching said pattern forming film using the remaining first film as a mask to remove the pattern forming film except for remaining pattern forming film corresponding to said remaining resist film, and then removing the remaining resist film;
    forming a second resist film on the remaining pattern forming film and grating film;
    providing a mask on an area of said second resist film substantially corresponding to said predetermined area;
    performing a non-beam exposure of the second resist film in an area other than said masked area and developing the non-beam exposure area to remove the second resist film only from this area thereby uncovering the remaining pattern form film in non-beam exposure area;
    etching said uncovered remaining pattern forming film;
    removing any remaining portions of the second resist film to expose remaining pattern form film;

etching the grating layer using the remaining pattern forming film as a mask to thereby form said grating pattern in said grating, and then removing all of the pattern forming film;

adding to said cladding layer such that said remaining grating material is embedded in the cladding layer.

14. The method of claim 13, wherein said performing a beam exposure comprises exposing only said predetermined area using one of an electron beam and an ion beam.

15. A semiconductor laser device manufactured using a method of manufacturing a semiconductor laser device comprising the steps of:

forming a layer of diffraction grating material for making the diffraction grating structure;

performing a beam exposure technique only in at least one first area of said layer where said diffraction grating structure is formed;

masking said diffraction grating structure; and performing a non-beam exposure technique in a second area of said layer where said diffraction grating structure is not formed.

* * * * *